United States Patent [19]

Batliwalla et al.

[11] Patent Number: 4,722,853

[45] Date of Patent: Feb. 2, 1988

[54] METHOD OF PRINTING A POLYMER THICK FILM INK

[75] Inventors: Neville Batliwalla, Foster City; Ravi Oswal, Sunnyvale; Gordon McCarty, San Jose; Jeff Shafe, Redwood City, all of Calif.

[73] Assignee: Raychem Corporation, Menlo Park, Calif.

[21] Appl. No.: 764,894

[22] Filed: Aug. 12, 1985

[51] Int. Cl.$^4$ .............................................. B05D 5/12
[52] U.S. Cl. ................................... 427/256; 252/511; 260/DIG. 38; 427/287
[58] Field of Search ................ 427/256, 287; 252/511; 260/DIG. 38

[56] References Cited

U.S. PATENT DOCUMENTS

| | | | |
|---|---|---|---|
| 3,331,823 | 7/1967 | Slanesi et al. | 526/253 X |
| 3,993,842 | 11/1976 | Hirsch et al. | 252/511 X |
| 4,479,890 | 10/1984 | Prabhu et al. | 252/511 X |

FOREIGN PATENT DOCUMENTS

| | | |
|---|---|---|
| 0074281 | 3/1983 | European Pat. Off. |
| 0158410 | 10/1985 | European Pat. Off. |
| 2098273 | 3/1972 | France |
| 2419570 | 10/1979 | France |

Primary Examiner—Evan K. Lawrence
Attorney, Agent, or Firm—Timothy H. P. Richardson; Herbert G. Burkard

[57] ABSTRACT

A method of printing an electrically conductive thick film ink onto a polymeric substrate. The ink comprises a polymeric binder, which is preferably a fluoropolymer, a solvent for the binder, and an electrically conductive filler. At the printing temperature the solvent is a latent solvent for the binder. After printing the temperature is raised, so that first the binder dissolves in the solvent, and then the solvent vaporizes and the binder cures. The ink may be applied to a conductive polymer, preferably fluoropolymer, substrate and used as a heater.

12 Claims, 4 Drawing Figures

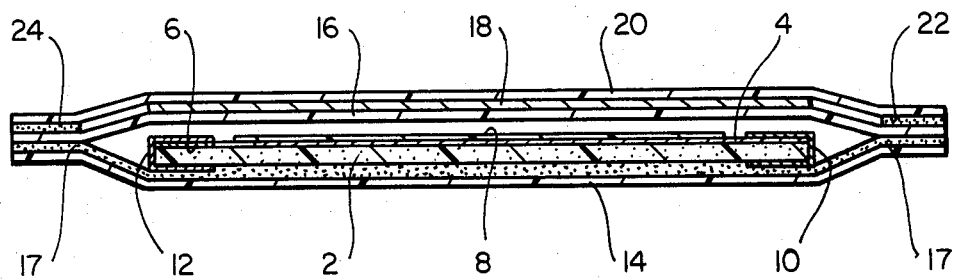
FIG_1
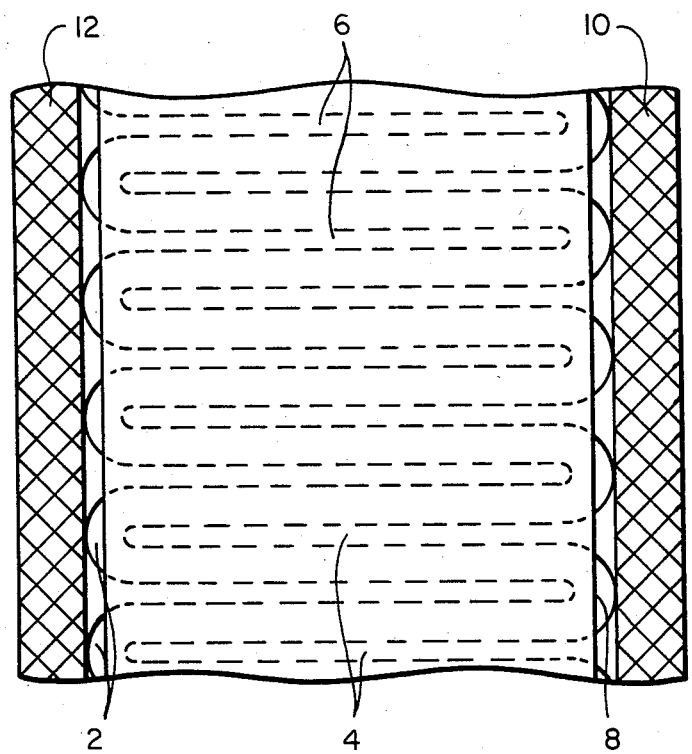
FIG_2

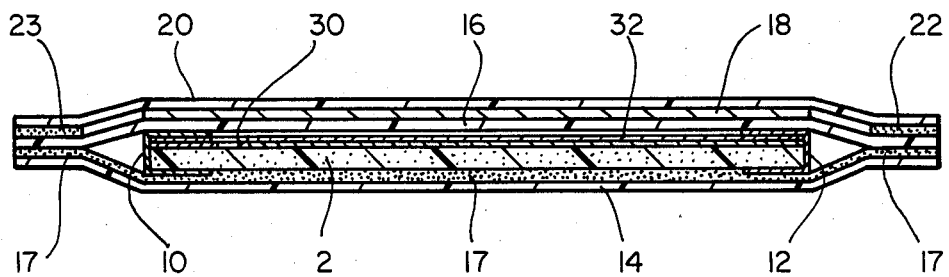
FIG_3
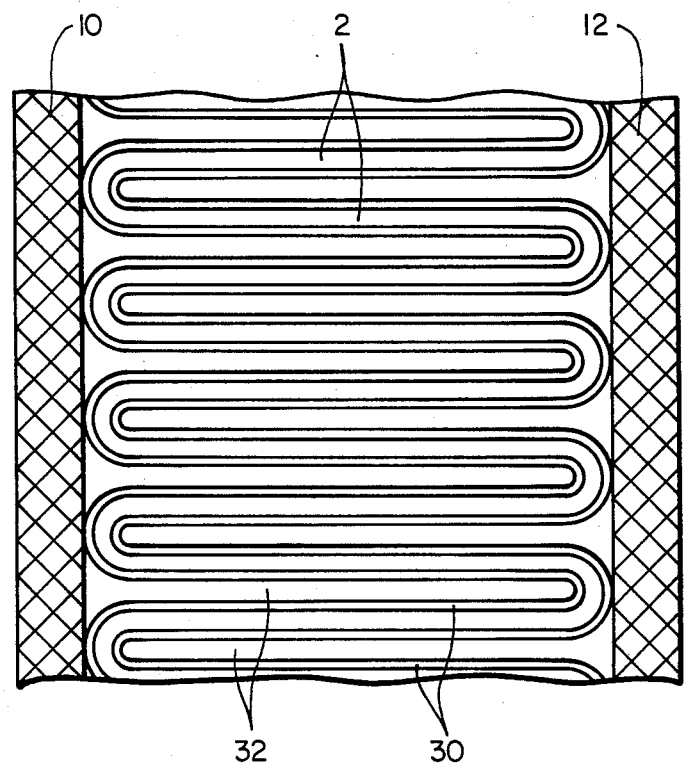
FIG_4

METHOD OF PRINTING A POLYMER THICK FILM INK

BACKGROUND OF THE INVENTION

1. Field of the Invention

This invention relates to methods of applying polymer thick film inks (hereinafter referred to as PTF inks) and devices incorporating PTF inks.

2. Introduction to the Invention

The use of PTF inks is well known in the electronics industry. The inks may have conductive, resistive, or insulating properties, and are typically applied onto a planar substrate in an electronics device, to impart the required electrical properties to that device. The most common use of PTF inks is in membrane switches, in which two flexible, insulating, plastic sheets, one of which is usually polycarbonate and the other of which is usually polyester, are screen printed on their mutually adjacent surfaces with a continuous layer of conductive silver-loaded PTF ink. The printed plastic sheets are separated by an apertured spacer through which electrical contact may be made by applying pressure to the sheets at the position of an aperture. Another known use of PTF inks is in multilayer circuits in which a conductive PTF ink is applied to a substrate, typically a ceramic substrate, in a pattern so as to define an electrical circuit.

PTF inks typically comprise three components (1) a polymeric binder, (2) a solvent (for the binder) and (3) a functional phase (also referred to in the art as a pigment or a filler). In the ink, as supplied, the polymeric binder is dissolved in the solvent and the functional phase is dispersed in that solution.

To apply the ink to a substrate, a screen printing technique is generally used; then the substrate is positioned in an oven to vaporize the solvent from the ink and cure the polymeric binder. The removal of the solvent and curing of the binder occurs in a single heating step. The term "cure" is used herein to include any solidification of the binder, whether or not it is accompanied by chemical reaction of the binder.

The purpose of the components of the ink are as follows. The binder acts as a matrix for the functional phase, binds the ink to the substrate, and gives some abrasion resistance. The solvent dissolves the polymer and controls the viscosity of the ink to provide the flow characteristics necessary for screen printing. The functional phase is generally a particulate filler and is selected to provide the required electrical properties of the ink.

Typical organic binders used in PTF inks include cellulosic resins, epoxies and thermoplastic polymers, for example polyesters, acrylics and vinyl copolymers. Typical solvents include ketones, alcohols, aromatics and chlorinated solvents. The choice of the functional phase depends on the electrical properties of the filler. Particulate silver is typically used for conductive inks, and particulate carbon for resistive inks.

SUMMARY OF THE INVENTION

We have discovered a method of applying a novel PTF ink to a substrate, in which, at room temperature (which is defined as 20° C. for the present application), the binder is in the form of solid particles which are dispersed in a liquid, the liquid being a solvent for the binder at a higher temperature. Such a liquid is called herein a "latent solvent".

A conductive polymer is a mixture comprising a conductive filler and an organic polymer, the filler being dispersed in the organic polymer or otherwise held together by the organic polymer. The conductive polymer may exhibit PTC behavior. Documents describing conductive polymer compositions and devices comprising them include U.S. Pat. Nos. 2,952,761, 2,978,665, 3,243,753, 3,351,881, 3,571,777, 3,757,086, 3,793,716, 3,823,217, 3,858,144, 3,861,029, 3,950,604, 4,017,715, 4,072,848, 4,085,286, 4,117,312, 4,177,376, 4,177,446, 4,188,276, 4,237,441, 4,242,573, 4,246,468, 4,250,400, 4,252,692, 4,255,698, 4,271,350, 4,272,471, 4,304,987, 4,309,596, 4,309,597, 4,314,230, 4,314,231, 4,315,237, 4,317,027, 4,318,881, 4,327,351, 4,330,704, 4,334,351, 4,352,083, 4,388,607, 4,398,084, 4,413,301, 4,425,397, 4,426,339, 4,426,633, 4,427,877, 4,435,639, 4,429,216, 4,442,139, 4,459,473, 4,481,498, 4,476,450, and 4,502,929; J. Applied Polymer Science 19, 813–815 (1975), Klason and Kubat; Polymer Engineering and Science 18, 649–653 (1978), Narkis et al; and commonly assigned U.S. Ser. No. 601,424 now abandoned, published as German OLS No. 1,634,999; U.S. Ser. No. 732,792 (Van Konynenburg et al), now abandoned, published as German OLS No. 2,746,602; U.S. Ser. No. 798,154 (Horsma et al), now abandoned, published as German OLS No. 2,821,799; U.S. Ser. No. 134,354 (Lutz); U.S. Ser. No. 141,984 (Gotcher et al), published as European Application No. 38,718; U.S. Ser. No. 141,988 (Fouts et al), published as European Application No. 38,718, U.S. Ser. No. 141,989 (Evans), published as European Application No. 38,713, U.S. Ser. No. 141,991 (Fouts et al), published as European Application No. 38,714, U.S. Ser. No. 150,909 (Sopory), published as UK Application No. 2,076,106A, U.S. Ser. No. 184,647 (Lutz), U.S. Ser. No. 250,491 (Jacobs et al) published as European Application No. 63,440, U.S. Ser. Nos. 272,854 and 403,203 (Stewart et al), published as European Patent Application No. 67,679, U.S. Ser. Nos. 274,010 (Walty et al), 300,709 and 423,589 (Van Konynenburg et al), published as European Application No. 74,281, U.S. Ser. Nos. 369,309 (Midgley et al), 483,633 (Wasley), 493,445 (Chazan et al), published as European Patent Application No. 128,664, U.S. Ser. No. 606,033, (Leary et al), published as European Application No. 119,807, U.S. Ser. Nos. 509,897 and 598,048 (Masia et al) published as European Application No. 84,304,502.2, U.S. Ser. No. 524,482 (Tomlinson et al) published as European Application No. 84,305,584.7, U.S. Ser. Nos. 534,913 (McKinley), 535,449 (Cheng et al) published as European Application No. 84,306,456.9, U.S. Ser. No. 552,649 (Jensen et al) published as European Application No. 84,307,984.9, U.S. Ser. Nos. 573,099 (Batliwalla et al) and 904,736, published as UK Pat. Nos. 1,470,502 and 1,470,503, and commonly assigned applications Ser. Nos. 650,918 (Batliwalla et al, MP0959), 650,920 (Batliwalla et al, MP0961-US1), continuation-in-part Ser. No. 663,014 (Batliwalla et al, MP0961-US2), continuation-in-part Ser. No. 735,408 (Batliwall et al, MP0961-US3), Ser. No. 650,919 (Batliwalla et al, MP0962), Ser. No. 650,921 (Kheder, MP0973), Ser. No. 711,790 (Carlomagno, MP0991), Ser. No. 667,799 (Frank MP0998), Ser. No. 711,908 (Ratell, MP1016), Ser. No. 711,907 (Ratell, MP1021), Ser. No. 711,909 (Deep et al, MP1022), Ser. No. 720,118 (Soni et al, MP1039), and Ser. No. 711,910 (Au et al, MP1044). The disclosure of each of the patents, publications and applications referred to above is incorporated herein by reference.

The present invention provides a method of printing a novel polymer thick film ink onto a substrate wherein the ink comprises:

(a) a binder comprising an organic polymer,
(b) a latent solvent for the binder, and
(c) an electrically conductive particulate filler.

wherein at room temperature the binder is in the form of solid particles dispersed in the solvent, and at the solvation temperature of the binder in the solvent, $T_S$, (as hereinafter defined), or at higher temperatures, the binder is dissolved in the solvent, wherein $T_S$ is higher than room temperature.

The values for the solvation temperature of the binder in the latent solvent, $T_S$, in the present specification are calculated according to the following method. At room temperature a dispersion of the binder in the latent solvent is prepared by adding 5% by weight (based on the total weight of the dispersion) of said binder particles to the latent solvent. Then the dispersion is heated at a rate of 5° C. per minute, stirring continuously. The temperature at which the solution becomes clear is the solvation temperature $T_S$ for that binder/solvent combination.

The method of applying a polymer thick film ink to a substrate comprises:

(1) printing onto the substrate a polymer thick film ink comprising an electrically conductive particulate filler, an organic polymer binder in the form of solid particles, and a solvent, the particulate components being dispersed in the solvent, and
(2) increasing the temperature above the printing temperature to dissolve the solid binder particles in the solvent, and then to vaporize the solvent and cure the polymeric binder.

As used herein, references to increasing the temperature include increasing the temperature at a continuous rate, or in a step-wise manner, or in any other way. In preferred embodiments the temperature is increased using an oven.

BRIEF DESCRIPTION OF THE DRAWINGS

The invention is diagrammatically illustrated in the accompanying drawings in which FIG. 1 is a cross section through a first device produced according to the invention, FIG. 2 is a plan view of the device of FIG. 1, FIG. 3 is a cross section through a second device produced according to the invention, including two layers of PTF inks, and FIG. 4 is a plan view of the device of FIG. 3.

DETAILED DESCRIPTION OF THE INVENTION

The method of the invention uses a PTF ink in which the solvent for the binder is a latent solvent. The ink can be applied to any substrate, including conventional substrates such as the polyester sheets used in membrane switches. Preferably, however, the ink is applied to a conductive substrate.

The use of a latent solvent makes it possible to use binders which have not hitherto been used, for example, because at the printing temperature there is either no true solvent for that binder or those solvents that are available are unacceptable for some other reason, for example, because they are toxic, or because they do not have the other desired parameters of the solvent, for example good wettability of the binder material, or because they detrimentally affect the emulsions typically used on the screen in the screen printing technique, or for any combination of those or other reasons. Thus according to the present invention it has been possible to use a PTF ink comprising a semicrystalline fluoropolymer (polyvinylidene fluoride) as the binder material. PTF inks comprising semicrystalline fluoropolymers as the binder material are novel per se and form part of the present invention. As used herein the term "semicrystalline" polymer means any polymer having at least 5% crystallinity.

Depending on the choice of polymeric material of the binder, a solvent may be a "true solvent" or a "latent solvent" for that binder. Having regard to his own knowledge and the disclosure herein, one skilled in the art will readily be able to select an appropriate latent solvent for a given binder material, either from known solubility parameter data or by routine experiment. Preferably the latent solvent selected is one which wets the binder. Examples of latent solvents that may be used, for example for a fluoropolymer such as polyvinylidene fluoride, include cyclohexanone, butyrolactone, isophorone and carbitol acetate. It is particularly preferred to use isophorone.

Depending on the desired electrical properties of the ink, the filler may have conductive, resistive or insulating properties. The selection of the type, quantity and particle size of the filler required to give the desired results is well known and well documented in the art.

To apply the ink to a substrate, the ink is first printed onto the substrate, preferably by screen printing and preferably at room temperature (20° C.). Then the ink is heated to dissolve the binder in the solvent, vaporize the solvent and cure the binder. The vaporization of the solvent (which effectively dries the binder) may alone effect curing of the binder, or the curing may involve a chemical reaction. The ink is preferably heated up to, and held at a predetermined temperature, which is hereinafter also referred to as the "cure", temperature, $T_c$. The ink is held at that temperature to effect complete vaporization and removal of the solvent and curing of the binder. Preferably a continuous rate of heating is used, for example by using an oven. During the heating the binder dissolves in the solvent. This occurs at a specific temperature, the solvation temperature, as hereinbefore defined. Vaporization of the solvent occurs at all temperatures, but the rate of vaporization increases with temperature (up to the boiling point). The predetermined cure temperature, $T_c$ at which the ink is held to vaporize the solvent and cure the ink, is preferably at least 15° C., more preferably at least 30° C. above the solvation temperature $T_S$ of the binder in the solvent. This is so that substantially complete solvation occurs.

The predetermined cure temperature, $T_c$, must be lower than the melting point of the substrate, so that the integrity of the substrate is maintained during the curing process. The melting point of the substrate is defined as the peak in the curve of a DSC (differential scanning calorimeter) curve. Preferably the predetermined cure temperature $T_c$ is at about the temperature of the onset of melting $T_{om}$ of the substrate, wherein the temperature of the onset of melting is defined as the point of significant increase in slope of the DSC melting curve.

As described above the vaporization rate of the solvent increases with the temperature up to the boiling point of that solvent. Above the boiling point the vaporization rate is constant. Preferably the predetermined cure temperature $T_c$ is at least 10° C., more preferably at least 30° C. lower than the boiling point of the solvent. This is because the rate of vaporization at the boiling point may be so fast that it causes voiding of the ink film, or a "skin-over" effect, that is trapping of solvent within a cured "skin" of the ink film. For most solvent-/substrate combinations used, however, the boiling point of the solvent is above the melting point of the substrate. It is accordingly never reached.

In a preferred ink a polyvinylidene fluoride binder is used with an isophorone solvent, which ink is applied to a polyvinylidene fluoride substrate. The solvation temperature of that binder in that solvent is 100° C. The temperature of the onset of melting and the melting point (as hereinbefore defined) of that substrate are 135° C. and 165° C. respectively, and the boiling point of that solvent is 215° C. The predetermined cure temperature, selected to give the optimum rate of vaporization and curing is 135° C.

In preferred methods of the present invention, the substrate comprises a conductive polymeric material. In such embodiments the organic polymer of the ink binder is preferably selected to be a material which has good adhesion to the polymeric component of the conductive polymeric material. Especially preferably the polymer component of the conductive polymeric material and the binder of the ink are the same polymer. We have found that where the components are so selected, good physical contact properties, and in particular improved electrical contact properties, between the ink and the conductive substrate are achieved, compared to similar devices in which the polymeric components are not so selected.

In a comparative test a number of devices were prepared by printing PTF inks (both commercially available resistive PTF inks and a resistive ink according to the present invention) onto conductive polymer substrates comprising polyvinylidene fluoride. The printing was in a pattern so as to form electrodes. The binder in the ink according to the invention was polyvinylidene fluoride. None of the binders in the commercially available inks was polyvinylidene fluoride (since none is available). The ink electrodes were powered and the high temperature resistance stability $R_n$ and the voltage stability of the devices were measured. Ageing of the devices, in order to determine the high temperature resistivity of the devices were carried out at 107° C. (225° F.). The high temperature resistance stability $R_n$ was computed as the ratio of the resistivity of the device after 1000 hours ageing to its initial resistivity, all resistivity values being measured at 20° C. Ideally that ratio is 1. The voltage stability was recorded in terms of the linearity ratio (LR) which is the ratio of the resistance at a low voltage (typically 30 mV) to the resistance at a high voltage (typically 100 V). Ideally that ratio is 1. The linearity ratio was measured after 1000 hours of current passage through the device. The results are shown in table 1 below, in which inks Samples Nos. 1 to 8 are commercially available inks and ink Sample No. 9 is an ink according to the present invention.

TABLE 1

| Sample No. | Ink | Binder | 1000 hr Rn | 1000 hr. Linearity Ratio |
|---|---|---|---|---|
| (1) | 5524228 | Urethane | >20.0 | >18.0 |
|  | Supplied by Acheson | | | |
| (2) | 41755 | acrylic & vinyl | >20.0 | >36.0 |
|  | Supplied by Acheson | | | |
| (3) | 5030-7 | epoxy | >20.0 | >40.0 |
|  | Supplied by Amican | | | |
| (4) | 1111-S | epoxy | 2.10 | 1.102 |
|  | Supplied by E.S.L. | | | |
| (5) | SS24302 | Viton | 1.95 | 2.69 |
|  | Supplied by Acheson | | | |
| (6) | 504SS | Viton | 2.00 | 1.026 |
|  | Supplied by Acheson | | | |
| (7) | 426SS | polyester & vinyl | 2.01 | 1.087 |
|  | Supplied by Acheson | | | |
| (8) | SS24360 | vinyl | 1.39 | 1.003 |
|  | Supplied by Acheson | | | |
| (9) | GM11 | Kynar PVF$_2$ | 1.20 | 1.002 |

The term "vinyl" is understood to include any polymer blends of polyvinylidene and vinyl acetate. A typical vinyl comprises 95% by weight polyvinylchloride and 5% vinylacetate.

The best results were achieved for the ink in which the binder was polyvinylidene fluoride, that is it was the same as the polymer of the substrate. The next best results were achieved for Sample No. 8 in which the binder of the ink was vinyl. Of the binders of the other inks vinyl is the material which best adheres to the polymer of the substrate.

Another factor which is important for the selection of the material of the binder is its thermal stability. The binder is preferably thermally stable so that it does not shrink or degrade during the ageing process. The acrylic/vinyl and polyester/vinyl binders (Samples 2 and 7), for example have poor thermal stability. This is thought to account for their poor electrical behavior in the above tests.

Any suitable material may be used for the substrate and for the ink binder. As examples of materials that may be used there may be mentioned polyolefins and fluoropolymers. For some applications, for example where the ink printed substrate is to be used as a heating device, or as part of a heating device, it is desirable that the materials selected have good thermal stability. For these high temperature applications, and for other applications, fluoropolymers are preferably used. Especially preferably polyvinylidene fluoride is used. Preferably the fluoropolymer is a semicrystalline polymer.

In devices in which the substrate is a conductive polymer, the substrate preferably has a resistivity at 23° C. of at least 0.5 ohm.cm, more preferably in the range 0.5 to 100,000 ohm.cm. Such devices may be used for example as heating devices, with the conductive polymer providing a resistive heating element.

The conductive and resistive PTF inks may be used in heating devices. The conductive PTF inks preferably have a resistivity in the range $1 \times 10^{-5}$ to $1 \times 10^{-2}$ ohm.cm, more preferably in the range $1 \times 10^{-4}$ to $1 \times 10^{-3}$ ohm.cm, and contain silver as the predominant filler. Such inks may be used, for example, as electrodes for heating devices, the PTF ink electrodes being printed on a surface of the resistive substrate such that they conduct electric current from a bus bar to the surface of the resistive element. Preferably the heaters and printed electrodes are as described in copending commonly assigned patent application U.S. Ser. No. 573,099 (MP0897-US1 Batliwalla et al), abandoned, the disclosure of which is incorporated herein by reference. The resistive PTF inks preferably have a resistivity in the range $0.5 \times 10^{-2}$ to 10 ohm.cm, and contain carbon as the predominant filler. Such inks may be used in heating devices as an intermediate resistivity layer between the more conductive electrodes and the less conductive resistive substrate. The resistive ink layer improves the electrical contact between the electrodes and the resistive substrate. Such an application for the ink is described in copending commonly assigned patent application U.S. Ser. No. 735,408 (MP0961-US3 Batliwalla et al), abandoned, the disclosure of which is incorporated herein by reference.

In preferred embodiments, a further layer is bonded to the substrate after the ink has been printed onto the substrate. Where the device is a heater, for example the further layer may comprises a dielectric layer bonded to the substrate to improve the physical and electrical properties of the heater. Such a heater incorporating a dielectric layer is disclosed in copending and commonly assigned patent application U.S. Ser. No. 735,409 (Batliwalla et al, MP1062-US1) abandoned, the disclosure of which is incorporated herein by reference.

In order for the device to function as a heater, or to allow deposition onto the substrate of a further layer, it is desirable for the substrate to have good physical and electrical properties.

Where a further layer is bonded to the substrate it can affect the physical and/or electrical contact between the ink and the substrate. Where a further layer is used over a conductive substrate, it is particularly preferred that the polymeric component of the conductive polymer substrate is the same as the polymer component of the binder. This is shown by the following comparative test.

Two devices (Sample Nos. 10 and 11) were prepared, similar to Samples 8 and 9 described above, but including a silicone dielectric layer bonded to the polyvinylidene fluoride (Kynar) substrate in the manner described in the above mentioned copending, commonly assigned application U.S. Ser. No. 735,409 (Batliwalla et al, MP1062-US1). The linearity ratio LR measured at 20° C. (after ageing for 1000 hrs. at 107° C. (225° F.)) was measured, and compared to that without the dielectric layer. The results are set out in Table 2 below.

TABLE 2

| Sample No. | Ink | Binder | 1000 hr L.R. without dielectric layer | 1000 hr L.R. with dielectric layer |
|---|---|---|---|---|
| (10) | SS24360 Supplied by Acheson | vinyl | 1.003 | 1.036 |
| (11) | | polyvinylidene fluoride (Kynar) | 1.002 | 1.003 |

Without the dielectric layer, for a polyvinylidene fluoride (Kynar) substrate, the inks with the vinyl and polyvinylidene fluoride (Kynar) binder inks both provide devices with acceptable linearity ratios. However, with the applied dielectric layer only the ink with the polyvinylidene fluoride (Kynar) binder provides a device with an acceptable linearity ratio.

Referring now to the drawing, the Figures illustrate a heater comprising a laminar conductive polymer resistive element 2 having a conductive PTF ink printed on the top surface thereof in the form of interdigitated electrodes 4 and 6.

In the printed and cured form as shown in the device, the ink comprises a polyvinylidene fluoride binder containing a functional phase or filler of silver, graphite and carbon black particles. Before application to the device the ink also comprises an isophorone solvent which at room temperature is a latent solvent for the binder. The ink is applied to the resistive element 2 by first screen printing the ink on the element at room temperature, then raising the temperature to dissolve the binder in the solvent, then further raising the temperature to vaporize the solvent and cure the binder.

A dielectric layer 8 overlies the interdigitating portions of the electrodes but does not extend to the longitudinal margins of the electrodes. Bus bars 10 and 12 extend along the longitudinal margins of the electrodes.

An insulating jacket (shown in FIG. 1 only) is formed around the heating element, and bus bars by a polymeric bottom sheet 14 and a polymeric top sheet 16. Sheet 14 is secured to the bottom of the heating element 2, and to the edge portions of the top sheet by a substantially continuous layer of adhesive 17 (as shown), or by melt bonding (not shown). The top sheet 16 is adjacent to but not secured to the bus bars 10 and 12, the dielectric 8, the electrodes 4 and 6, or the resistive element 2. On top of the top sheet there is a metallic, e.g., copper, foil 18 which is maintained in position by an outer polymeric insulating sheet 20 whose marginal portions are secured to the marginal portions of the sheet 16 by adhesive layers 22 and 24 (as shown) or by melt bonding.

FIGS. 3 and 4 show a heater similar to that shown in FIGS. 1 and 2 comprising a laminar conductive polymer resistive element 2. Printed on the top surface of the resistive element 2 is an interdigitated pattern of a resistive ink 30 which contains carbon black, or a mixture of graphite and carbon black, as the conductive filler, and has substantially lower resistivity than the conductive polymer in the element 2. Printed over the resistive ink 30 are interdigitated electrodes 32 which are composed of a conductive PTF ink containing a metal filler e.g. silver, as the conductive filler and having lower resistivity than the conductive polymer in the resistive pattern 30. The configuration of the electrodes 32 is identical to that of the underprint layer 30, but the electrodes are narrower than the underprint layer. Thus the layer 30 extends between the electrodes 32 and the resistive element 2, and extends slightly beyond the electrodes 32. Bus bars 10 and 12, as used in the device of FIGS. 1 and 2 are provided. An insulating jacket in the form of a polymeric bottom sheet 14 and a polymer top sheet 16 which is secured by adhesive 17 or by a melt bond, is also provided as in the device illustrated in FIGS. 1 and 2, as is a metallic foil 18 which is held in place by polymeric insulating sheet 20 secured to sheet 18 by adhesive layers 22 and 23 or by a melt bond.

Examples of conductive PTF inks and resistive inks according to the invention, and a method of making the inks, are now given.

EXAMPLE

Conductive Ink

A conductive PTF ink having a resistivity of $1 \times 10^{-3}$ ohm.cm was prepared, having the following composition:

| | wt % |
|---|---|
| Kynar 461, (binder) | 19.3 |
| Silver Flake 11401 (filler) (10 m diameter size) | 43.1 |
| Graphite 870 (filler) | 6.3 |
| Carbon black XC72 (filler) | 1.8 |
| Cab-O-Sil M5 | 1.8 |

-continued

| | wt % |
|---|---|
| Isophorone (solvent) | 27.7 |

Silver Flake 11401 supplied by Aesar, Johnson Mathey U.S.A.
Kynar 461 is a polyvinylidene fluoride supplied by Pennwalt U.S.A.
Graphite 870 is supplied by Ashbury Graphite.
Carbon black XC72 is supplied by Cabot.
Cab-O-Sil is a fumed silica supplied by Cabot.

The conductive ink may be used, for example as the electrodes 4 and 6 in the heater described with reference to FIGS. 1 and 2, or as the electrodes 32 in the heater described with reference to FIGS. 3 and 4.

Resistive Ink

A resistive PTF ink having a resistivity of 0.2 ohm.cm was prepared having the following composition.

| | wt % |
|---|---|
| Kynar 461 (binder) | 14.5 |
| Graphite 870 (filler) | 32.9 |
| Carbon Black XC72 (filler) | 2.2 |
| Cab-O-Sil | 0.7 |
| Isphorone (solvent) | 49.7 |

The resistive ink may be used, for example as the intermediate resistivity layer 30 in the heater described with references to FIGS. 3 and 4.

The conductive and resistive inks detailed above may be prepared by the following method.

Method

To a mixture of the carbon black and graphite, 80% of the isophorone is added, and mixed to a paste. The silver (where used), the Kynar powder, and two thirds of the Cab-I-Sil powder are added sequentially, stirring well between each addition. If the paste becomes too thick, additional solvent (isophorone) is added.

The blend is placed in a 3-roll paint mill in which there is a 28 mm gap between the feed and outer rollers, and in which there is no contact between the take-off and central rollers. The remaining Cab-O-Sil is added to the mill and the blend milled for 45 minutes. Finally the ink is removed from the mill by adjusting the position of the take-off roller, and additional solvent added, if required, to give the required viscosity for screen printing.

We claim:

1. A method of applying a polymer thick film ink to a substrate, which method comprises:

(1) printing onto the substrate a polymer thick film ink which comprises (a) a binder comprising an organic polymer,
   (b) a latent solvent for the binder, and
   (c) an electrically conductive particulate filler, the binder and the solvent being such that (i) at room temperature the binder is in the form of solid particles dispersed in the solvent, and (ii) there is a temperature above room temperature at which the binder is dissolved in the solvent;

said printing being carried out under conditions such that the electrically conductive particulate filler is dispersed in the latent solvent and the binder is in the form of solid particles dispersed in the latent solvent; and (2) after step (1), increasing the temperature of the ink printed on the substrate so as first to dissolve the solid binder particles in the latent solvent, and then to vaporize the latent solvent and cure the polymeric binder.

2. A method according to claim 1 wherein the binder comprises a semicrystalline fluorinated organic polymer.

3. A method according to claim 1 wherein the ink is printed at room temperature.

4. A method according to claim 1, wherein the temperature is increased to a predetermined temperature $T_c$ and held at that temperature to vaporize the solvent and cure the polymeric binder.

5. A method according to claim 4, wherein the predetermined temperature $T_c$ is at least 15° C. above the solvation temperature $T_s$ of the binder in the solvent.

6. A method according to claim 4, wherein the predetermined temperature $T_c$ is at least 10° C. lower than the boiling point $T_b$ of the solvent, measured at atmospheric pressure.

7. A method according to claim 4 wherein the predetermined temperature $T_c$ is substantially the same as the temperature of the onset of melting $T_{om}$ of the substrate, wherein $T_{om}$ is the point of significant increase in slope of a DSC melting curve.

8. A method according to claim 1, wherein the substrate comprises a conductive polymeric material.

9. A method according to claim 1, wherein the substrate comprises a fluorinated polymer.

10. A method according to claim 1 wherein the binder comprises polyvinylidene fluoride.

11. A method according to claim 1 wherein the latent solvent is selected from the group consisting of cyclohexanone, butyrolactone, isophorone, and carbitol acetate.

12. A method according to claim 1 wherein the latent solvent wets the binder at room temperature.

* * * * *